US00RE48112E

(19) United States
(12) Reissued Patent
Wong et al.

(10) Patent Number: US RE48,112 E
(45) Date of Reissued Patent: Jul. 21, 2020

(54) NOTCH FILTER FOR RIPPLE REDUCTION

(71) Applicant: Linear Technology LLC, Milpitas, CA (US)

(72) Inventors: Jeremy H. Wong, Sunnyvale, CA (US); Joseph G. Petrofsky, Nevada City, CA (US)

(73) Assignee: Linear Technology LLC, Milpitas, CA (US)

(21) Appl. No.: 16/043,486

(22) Filed: Jul. 24, 2018

Related U.S. Patent Documents

Reissue of:
(64) Patent No.: 9,685,933
Issued: Jun. 20, 2017
Appl. No.: 14/669,863
Filed: Mar. 26, 2015

U.S. Applications:
(60) Provisional application No. 62/041,388, filed on Aug. 25, 2014.

(51) Int. Cl.

| | |
|---|---|
| ***H03F 1/02*** | (2006.01) |
| ***H03H 19/00*** | (2006.01) |
| ***H03F 3/45*** | (2006.01) |
| ***H02M 1/15*** | (2006.01) |
| ***H02M 3/07*** | (2006.01) |

(52) U.S. Cl.
CPC ..... *H03H 19/004* (2013.01); *H02M 1/15* (2013.01); *H02M 3/07* (2013.01); *H03F 3/45475* (2013.01)

(58) Field of Classification Search
CPC ..... H03F 1/02; H03F 3/45; H03F 3/45475; H03H 19/00; H03H 19/004; H02M 1/15; H02M 3/07
USPC ..... 330/9, 252–261; 327/91, 94, 96
See application file for complete search history.

(56) References Cited

U.S. PATENT DOCUMENTS

| | | | | |
|---|---|---|---|---|
| 6,476,671 | B1 | 11/2002 | Tang | |
| 7,292,095 | B2 | 11/2007 | Burt et al. | |
| 7,518,440 | B1 | 4/2009 | Trifonov | |
| 7,586,368 | B2 | 9/2009 | Trifonov | |
| 7,724,080 | B2 | 5/2010 | Luff | |
| 7,764,118 | B2 | 7/2010 | Kusuda et al. | |
| 7,888,996 | B1 | 2/2011 | Barnett | |
| 7,973,596 | B2 | 7/2011 | Eschauzier et al. | |
| 8,072,262 | B1 * | 12/2011 | Burt | H03F 3/005 327/124 |
| 8,120,422 | B1 | 2/2012 | Huijsing et al. | |
| 9,246,446 | B2 * | 1/2016 | Nagahisa | H03F 3/185 |
| 2014/0210547 | A1 * | 7/2014 | Tomioka | H03F 3/387 330/9 |

* cited by examiner

*Primary Examiner* — My Trang Ton
(74) *Attorney, Agent, or Firm* — Knobbe, Martens, Olson & Bear, LLP

(57) ABSTRACT

A notch filter is controlled synchronously with a chopper to filter out chopping ripple. In one embodiment, the notch filter is coupled to the differential output of the chopper and includes a sampling capacitor, a hold capacitor, and a second set of switches between the sampling capacitor and the hold capacitor. The second set of switches is temporarily closed once per chopper switching cycle to transfer charge from the sampling capacitor to the hold capacitor such that the ripple from the chopper is not transferred to the hold capacitor. The voltage across the hold capacitor may be coupled to any other circuit, such as to the differential inputs of an amplifier.

33 Claims, 4 Drawing Sheets

NOTCH FILTER FOR RIPPLE REDUCTION

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

CROSS REFERENCE TO RELATED APPLICATIONS

This application *is a reissue of U.S. Pat. No. 9,685,933, which issued Jun. 20, 2017 from U.S. patent application Ser. No. 14/669,863, filed Mar. 26, 2015, which* claims priority from U.S. provisional application Ser. No. 62/041,388, by Jeremy H. Wong et al., filed Aug. 25, 2014, assigned to the present assignee and incorporated herein by reference.

FIELD OF INVENTION

The present invention relates to notch filters for reducing ripple in chopper stabilized circuits and, in particular, to a notch filter using capacitors, switches, and phased control signals.

BACKGROUND

Chopping is a common technique for reducing offset voltage, offset drift, and 1/f noise in circuits. This method translates DC and flicker noise to higher frequencies, an artifact of which is chopper noise or ripple. Switched capacitor filters are well suited for ripple suppression due to their high selectivity and rejection. The use of switched capacitor filters to reduce ripple is well known in the art.

The offset voltage of a differential amplifier is the voltage that needs to be added or subtracted from one of the input voltages so that, when the input voltages are equal, the output of the amplifier is precisely zero. The offset voltage gets amplified by the amplifier and downstream amplifiers.

One prior art technique for reducing ripple in a chopped operational amplifier is described in U.S. Pat. No. 7,292,095 to Burt, incorporated herein by reference, where the representative figures from that patent are reproduced as FIGS. 1A and 1B.

In the Burt circuit, a conventional input chopper 9 is connected between a differential input voltage Vin and a trans-conductance amplifier 2 to reverse the input polarity at a 50% duty cycle, and a synchronized output chopper 10 is connected to the differential output of the amplifier 2 to correct the signal path polarity. The equivalent input offset voltage of the amplifier 2 contributes equally during both phases, but appears in alternating polarities at the output of the output chopper 10. Therefore, the offset going into subsequent stages is ideally nullified, but the ripple caused by chopping is also added to the output signal. A switched capacitor notch filter 15, operating at precisely 90 degrees out of phase with the choppers (see the phase 3 and 4 signals), filters out the ripple at the chopper frequency. The remainder of the Burt circuit is related to frequency compensation and is not relevant to the present invention, which is a filter for removing chopper ripple.

Ripple at the output of the output chopper 10 due to offset in the amplifier 2 will be a square wave current that is synchronous with phase 1 and 2 (FIG. 1B). When integrated onto a capacitor, this square wave current will result in a triangle wave voltage. At the mid-point in time between the phase 1 and phase 2 chopping transitions, this differential voltage will be at the mid-point between the peaks and valleys of the triangle wave, ideally at the same exact voltage in the rising direction as well as the falling direction. An integrate-and-transfer function from one such mid-point to the next will result in a consistent output, thus greatly suppressing the ripple. These mid-points occur twice in each chopper cycle, so the filter ping-pongs between the capacitor C5 and capacitor C6 paths, each alternately integrating while the other is holding.

In the above-described Burt circuit, if the switched capacitor notch filter 15 is not operated at exactly 90 degrees out of phase with the choppers, there will still be some residual ripple in the generated signal. Furthermore, the notch filter 15 utilizes two ping-ponged signal paths, which adds circuit complexity and area.

What is needed is an improved notch filter design of the type that reduces or eliminates chopper ripple, does not require the generation of a control signal that is precisely 90 degrees out of phase with the chopper, and offers a reduction in circuit complexity and device area.

SUMMARY

Although the present invention relates to a notch filter, the design and operation of the notch filter is presented in the context of an operational amplifier. The notch filter may be used in any other circuit to remove chopper ripple from an upstream circuit. In an example of the present inventive circuit, the inventive notch filter is applied to the amplifier of FIG. 1A, although it can be applied in any other circuit that generates ripple.

In this embodiment, ripple from a conventional chopper-stabilized amplifier input stage, composed of an input chopper, a first input trans-conductor amplifier, and an output chopper, is filtered. To nullify the amplifier's offset voltage, the input chopper is connected between the differential input voltage Vin and the differential input terminals of the amplifier, and a synchronized output chopper is connected to the differential outputs of the amplifier. Although the offset voltage of the amplifier has been removed from the output of the output chopper, the signal has ripple at the chopper frequency. The ripple at the output of the output chopper will be a square wave current or a triangular wave voltage when integrated onto a capacitor.

The notch filter of the present invention will now be described in the context of eliminating the chopper ripple.

The 2-phase control signals to the choppers have a short non-overlap time during which all switches in the output chopper are open. This non-overlap time is necessary to avoid discharging a load capacitor, connected across the output of the output chopper, which would adversely affect the amplifier's gain. During the non-overlap time, the capacitor is disconnected from the preceding circuit with the output signal stored on it. This action is effectively a sampling event. Within this non-overlap time, two additional switches are briefly closed to couple the load capacitor to a "hold" capacitor. After the switches are opened, the hold capacitor holds the output voltage until the next cycle, since it is isolated from the output chopper. This switched capacitor configuration comprises a sample and hold circuit which, when operated synchronously with the output chopper, acts as a notch filter. Therefore, the differential signal across the hold capacitor contains no chopper ripple originating from the offset of the first amplifier.

The terminals of the hold capacitor provide the output signals of the inventive circuit. This output may be connected across the differential input terminals of a second amplifier, or connected to an analog-to-digital converter, or used for any other purpose.

Note that there is no requirement that the notch filter be switched at any particular phase during the chopper cycle, as long as it switches at the same point in the chopper cycle each time. To further add precision and efficiency to the amplifier, a "zeroing switch" is used. The zeroing switch is coupled across the differential outputs of the first amplifier. The zeroing switch is closed only during a time between the phases used to control the two choppers. This resets the output of the first amplifier, and the first amplifier does not have to discharge its parasitic output capacitance, so all the current output by the first amplifier can be amplified downstream.

Since it is easy to generate the control signals for the zeroing switch and the sample and hold switches within a non-overlap time between the chopper phases, the control of the present circuit is easier than the control of the above-described circuit by Burt, where the switching capacitor notch filter must be operated with control signals precisely 90 degrees out of phase with the chopper control signals. The switching of the switches in the notch filter and zeroing switch is not limited to the non-overlap times between chopper phases. Furthermore, the inventive filter requires only one signal path with reduced device count, circuit complexity, and area. The zeroing switch may be irrelevant for other types of circuits using the notch filter.

Various other embodiments are also described herein.

BRIEF DESCRIPTION OF DRAWINGS

Elements that are the same or equivalent are labeled with the same numerals.

DETAILED DESCRIPTION

Figures 1A, 1B:
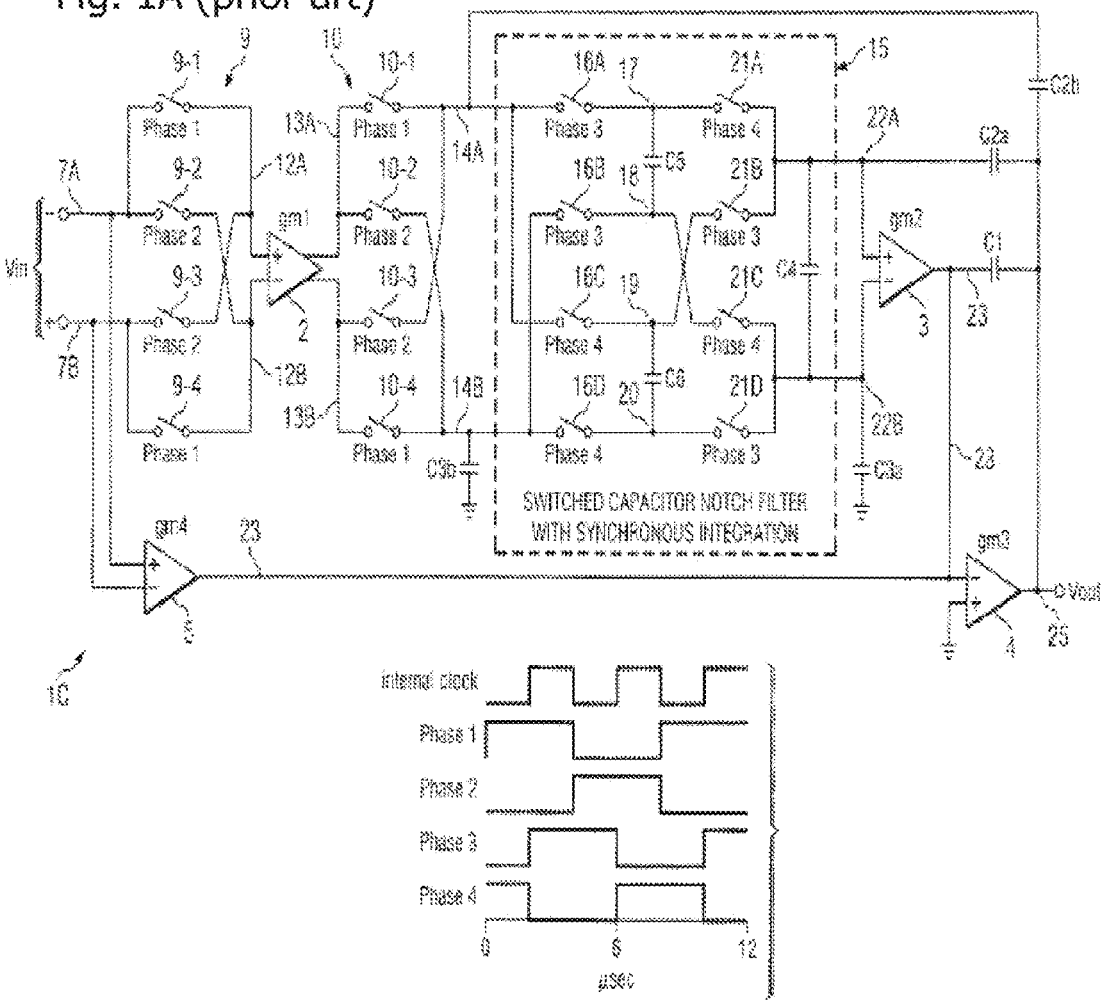
Fig. 1A (prior art)
Fig. 1B (prior art)
FIG. 1A illustrates a prior art operational amplifier having choppers for reducing offset voltage, and a switched capacitor notch filter, described in U.S. Pat. No. 7,292,095.
FIG. 1B is the switch timing diagram from the prior art U.S. Pat. No. 7,292,095.
Figure 2:
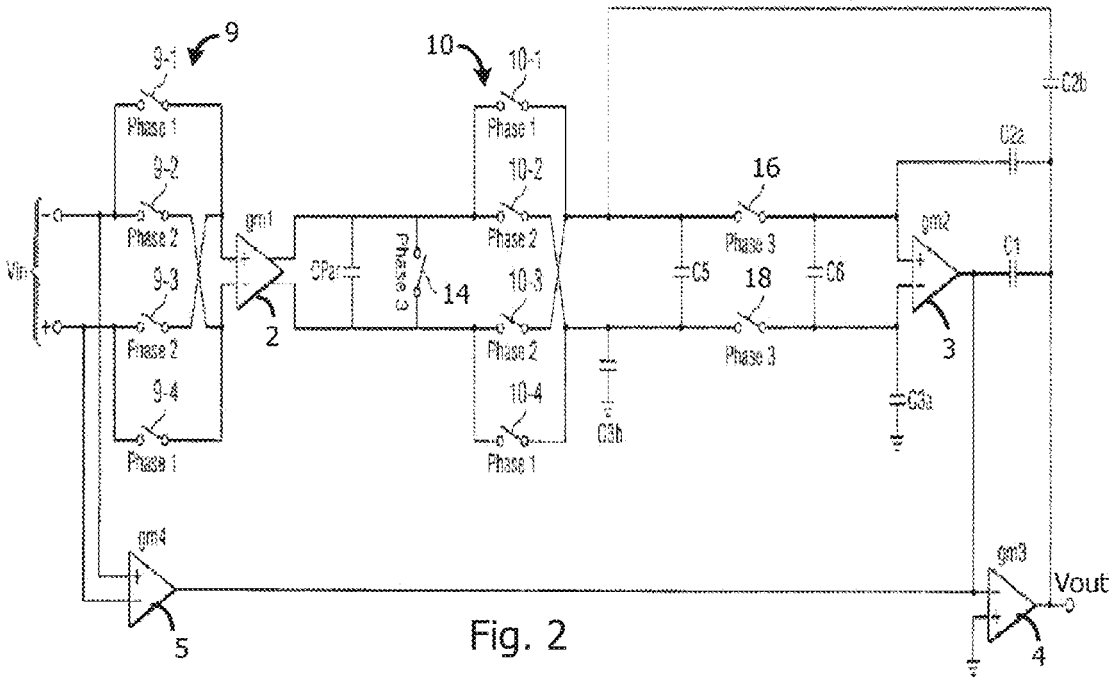
FIG. 2 illustrates a notch filter, in accordance with one embodiment of the present invention, that is used in an operational amplifier, similar to that of FIG. 1A, to eliminate the ripple generated by a chopper.

FIG. 2 illustrates the inventive notch filter circuit incorporated into the amplifier circuit of FIG. 1A. The details of the frequency compensation aspect of the circuit are well-known to those skilled in the art of differential amplifier design and need not be discussed herein. The present invention may be used in a wide variety of circuits to remove chopper ripple. The portions of the circuit of FIG. 2 that are identical to FIG. 1A are labeled with the same numerals.

All the amplifiers 2, 3, 4, and 5 are trans-conductance amplifiers with differential inputs. Amplifiers 3, 4, and 5, as well as capacitors C1, C2a, C2b, C3a, and C3b, are irrelevant to the present invention and are not further discussed herein. Additional information about those components may be found in U.S. Pat. No. 7,292,095.

Figure 3:
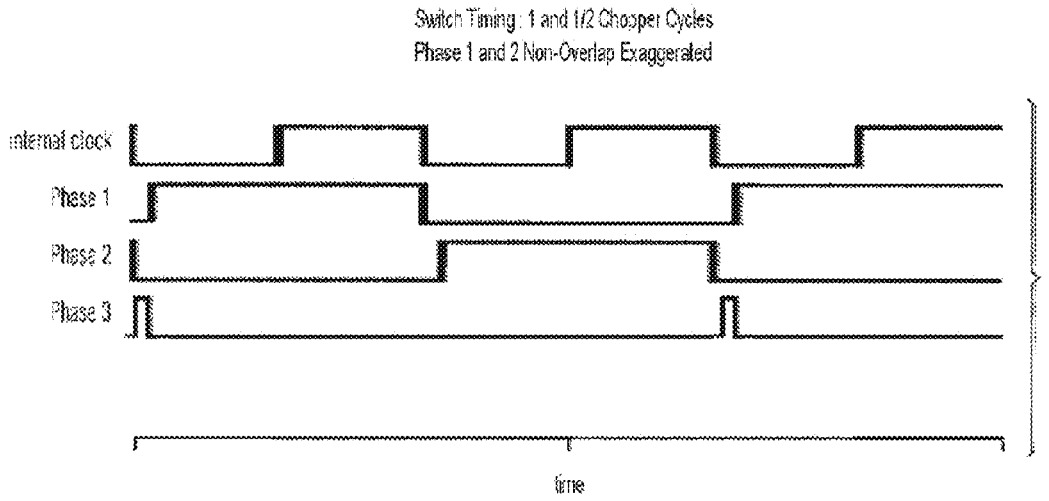
FIG. 3 illustrates control waveforms that may be applied to the circuit of FIG. 2, where certain control signals are applied during a non-overlapping period of the chopper control signals.

An input chopper 9 between the differential input voltage Vin and the differential inputs of the amplifier 2 is controlled by the phase 1 and opposite phase 2 signals shown in FIG. 3. Switches 9-1 and 9-4 are closed only when phase 1 is high, and switches 9-2 and 9-3 are closed only when phase 2 is high. All switches may be MOSFETs or other types of switches.

An output chopper 10 connected to the differential outputs of the amplifier 2 is also controlled by the phase 1 and phase 2 signals shown in FIG. 3. Switches 10-1 and 10-4 are closed when phase 1 is high, and switches 10-2 and 10-3 are closed when phase 2 is high. This is similar to the chopper method shown in U.S. Pat. No. 7,292,095 for reducing the effects of the amplifier 2 offset voltage.

There is also a phase 3 control signal generated, which is a short pulse at the beginning of each period during the non-overlapping times between the phases 1 and 2. Providing a small time gap between the phases 1 and 2 when neither phase is high, as shown in FIG. 3, avoids overlapping conductive states of the switches that would otherwise briefly short out input signals, output signals, or load capacitances. An actual transistor switch does not turn on and off instantaneously. For illustrative purposes, the non-overlapping times shown in FIG. 3 are greatly exaggerated relative to an actual embodiment. Ideally, the non-overlap time is insignificant relative to the period of the phase 1 and phase 2 signals.

A single internal clock is used to generate all three phases, and simple flip-flops, delay circuits, and one-shot circuits may be easily used to generate the three phases so they are synchronized. Such techniques are well known in the art. The clock rate may be within a wide range such as 10 kHz-100 kHz.

The phase 3 control signals are applied to a zeroing switch 14 and to switches 16 and 18 in a sample and hold circuit functioning as a notch filter.

The parasitic output capacitance CPar for the amplifier 2 is shown.

The output of the output chopper 10 is across the capacitor C5.

The choppers 9 and 10 act as open circuits during the non-overlapping time between the logical highs of the phase 1 and phase 2 signals. During this non-overlapping time, the phase 3 pulse is generated at the beginning of each cycle. The phase 3 pulse briefly closes the zeroing switch 14 and the switches 16 and 18. Closing the zeroing switch 14 shorts out the parasitic output capacitance CPar of the amplifier 2 so the differential output voltage is zero. The output chopper 10 is an open circuit during this time, so the shorting does not affect the voltage across the capacitor C5.

At the same time, pursuant to the phase 3 signal, the voltage across the capacitor C5 is applied to the capacitor C6 by the closing of switches 16 and 18. Effectively, capacitor C5 acts to sample the output of the output chopper 10 at the end of the phase 2 ON time, and capacitor C6 holds the transferred charge once the switches 16 and 18 are opened. The configuration of the capacitors C5 and C6 and the switches 16 and 18 can be considered a sample and hold circuit. Once the choppers 9 and 10 begin switching, any chopper ripple is isolated from the capacitor C6 since the switches 16 and 18 are open. Accordingly, the voltage across capacitor C6 is not affected by chopper ripple and is free from offset voltage errors generated in amplifier 2. The sample and hold circuit acts as a notch filter for the chopper ripple.

Note that, although the example switches the notch filter during the non-overlapping times, there is no requirement that the notch filter be switched at any particular phase during the chopper cycle, as long as it switches at the same point in the chopper cycle each time. The switching by the notch filter can even occur at multiple points symmetric about a chop transition.

The zeroing switch 14 is not essential but improves accuracy and performance. In practical circuits, the capacitance of capacitor C5 will be much larger than the parasitic capacitance CPar, and the voltage across the capacitance CPar will be nearly completely reversed by the transition from phase 2 to phase 1. The zeroing switch 14 discharges capacitance CPar during phase 3, which cuts in half the charge that the amplifier 2 needs to deliver to the capacitance CPar during this phase transition, thereby improving accuracy by allowing more of the amplifier 2's output signal to propagate downstream.

The amplifier 3 then amplifies the clean differential input signal across the capacitor C6. The amplifier 3 is not relevant to the present invention. Any high input impedance circuit may be connected to the capacitor C6.

Figure 4:
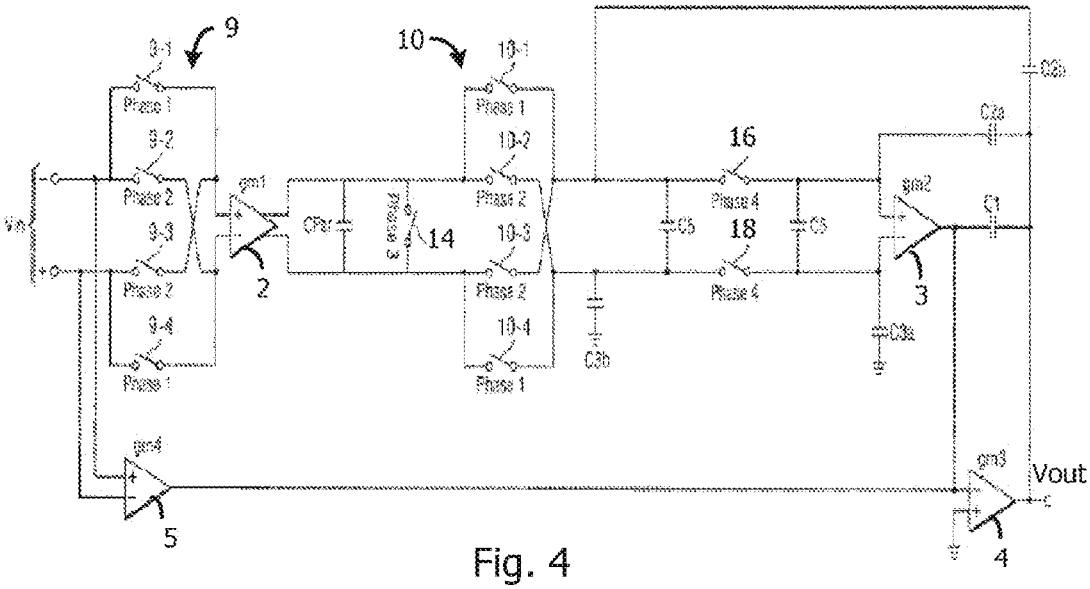
FIG. 4 illustrates the same circuit as FIG. 2 but where the sample and hold switches are controlled by a phase 4 waveform.
Figure 5:
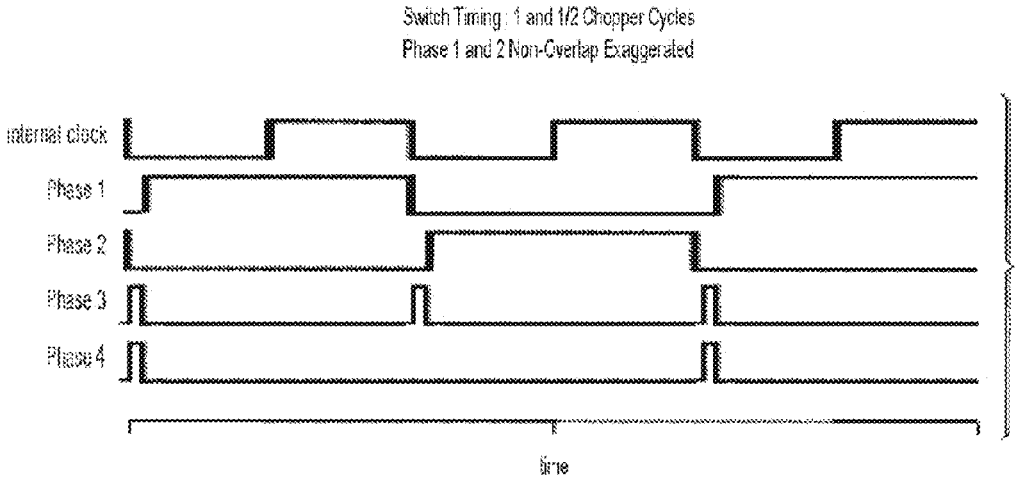
FIG. 5 illustrates the control waveforms that may be applied to the circuit of FIG. 4.

FIG. 4 illustrates the same circuit as FIG. 2 but where the switches 16 and 18 are controlled by a phase 4 control signal, shown in FIG. 5.

As seen in FIGS. 4 and 5, the zeroing switch 14 (operated by the phase 3 signal) is closed twice per switching cycle during the non-overlapping switch times of the chopper switches. In contrast, the sample and hold switches 16 and 18 are only closed once at the end of each switching cycle during the non-overlapping switch times of the chopper switches. This is needed since the voltage across the capacitor C5 has the offset nullified only after a complete chopper cycle.

Again, the zeroing switch 14 is not essential but improves performance. Zeroing the output of the amplifier 2 by discharging its parasitic output capacitance CPar reduces the switched-capacitor resistance by 2× compared to a non-zeroed circuit. Further, the amplifier 2 does not have to discharge the capacitance CPar, allowing the current generated by the amplifier 2 to contribute to signal amplification, improving efficiency. Because the switched-capacitor resistance is inversely proportional to chopping frequency, the additional zeroing may allow for the chopping rate to be increased without losing gain in the cases where the capacitance CPar dominates the output impedance. This allows for greater design freedom in selecting a chopping frequency and allows the use of smaller components. The zeroing after each cycle also ensures that each sample and hold is unaffected by any previous cycle. Hence, the zeroing switch 14 improves the accuracy of the signal across the capacitor C6.

Figure 6:
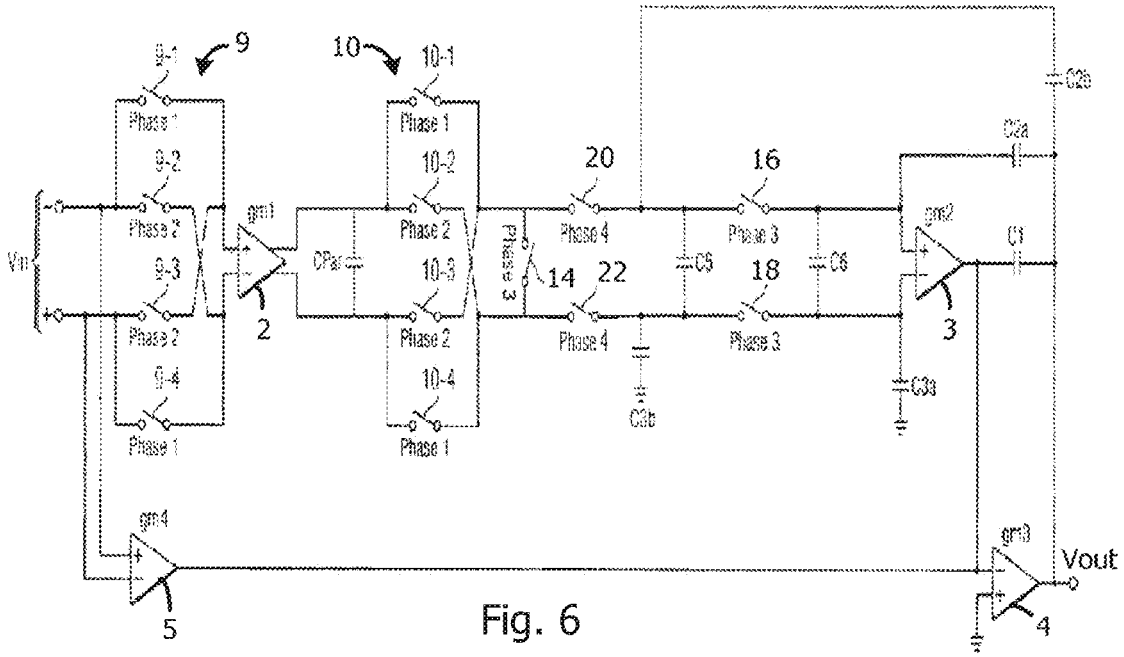
FIG. 6 illustrates a variation of the embodiment of FIG. 2.
Figure 7:
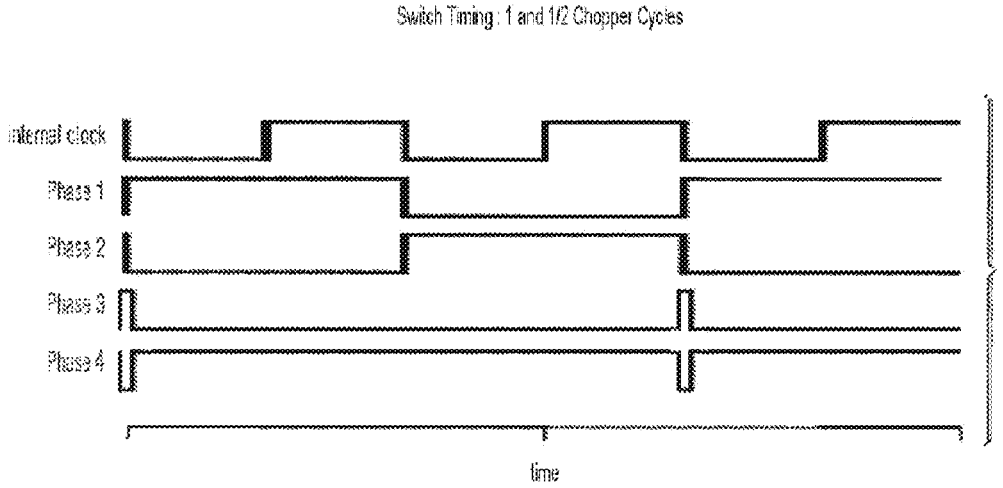
FIG. 7 illustrates the control waveforms that may be applied to the circuit of FIG. 6, where certain control signals are applied at the beginning of the chopper switching cycle, rather than during any non-overlapping period of the chopper control signals.

FIG. 6 illustrates a variation of the amplifier of FIG. 2 where the zeroing switch 14 is located downstream from the output chopper 10 and where an additional set of isolation switches 20 and 22 is located between the zeroing switch 14 and the sample and hold circuit comprising capacitors C5 and C6 and switches 16 and 18. The amplifier of FIG. 6 is controlled by the phase signals in FIG. 7, where the phase numbers controlling the switches are identified in FIG. 6. In this embodiment, the zeroing switch 14 is closed at the start of the phase 1 switching cycle and may overlap a portion of the ON times of the phase 1 or phase 2 switches in the output chopper 10. The zeroing switch 14 discharges parasitic capacitances in both the amplifier 2 and the output chopper 10. The phase 4 isolation switches 20 and 22 are closed during all times except when the zeroing switch 14 and the switches 16 and 18 are closed. When the zeroing switch 14 is closed, the switches 20 and 22 are opened so as not to affect the sample and hold circuit comprising the capacitors C5 and C6 and the switches 16 and 18. Although there may be a non-overlap time in the chopper switches, it is not relevant to the operation of FIG. 6. Chop transitions may occur during the time when the phase 3 signal is high and the isolation switches 20 and 22 are opened, since the chop transitions do not affect the value stored in the capacitor C5.

The switch configuration of FIG. 6 offers the advantage of reducing charge loss from the capacitance CPar while at the same time removing the zeroing switch's 14 own parasitic capacitance from the amplifier 2 output.

In an alternative embodiment, the switching methods of FIGS. 4-7 can be combined by cycling the zeroing switch 14 and the phase 4 isolation switches 20/22 twice per chopping cycle while operating the sample and hold switches 16 and 18 once per cycle.

In another embodiment, the zeroing switch 14 is not included in the circuit, and the switches 10-1 through 10-4 in the output chopper 10 are briefly all closed, once per output chopper cycle, to perform the intermittent shorting function.

Although the switches for the notch filter are shown occurring at the non-overlapping off times of the choppers or at the beginning or end of a chopper phase signal, the notch filter switches only have to switch at the same time or times during each chopper cycle so that the triangular wave across the capacitor C5 is at the same magnitude each time the notch filter switches are briefly closed (assuming the input voltages have not changed). This still eliminates the chopper ripple while easing the timing requirements for the notch filter.

Accordingly, the notch filter circuits described herein, as compared to the prior art previously described, has fewer switches, lower losses, fewer clock phases, more relaxed tolerance for the clock phases, lower noise, higher efficiency, and reduced effects from parasitic capacitances. This results in less complexity and a smaller die and allows for greater design flexibility with the chopper frequency, while improving performance.

The entire amplifier circuit, including all capacitors, switches, timers, clocks, etc., is ideally formed within a single IC to best match components, maximize timing precision, maximize bandwidth, minimize noise, and minimize cost. Many more devices, unrelated to the amplifier, may also be formed in the same IC to create any system.

The notch filter circuit may be used in any other circuit to eliminate ripple at the chopper frequency. The choppers may operate at a fixed frequency or at a variety of frequencies in a spread spectrum approach to reduce EMI.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. A circuit comprising:

an input chopper receiving an input signal;

an amplifier receiving a first signal corresponding to an output of the input chopper;

an output chopper, synchronized with the input chopper, receiving a second signal corresponding to an output of the amplifier, the output chopper comprising a first set of switches controlled by at least clocked phase 1 and phase 2 control signals at a chopping frequency, the output chopper outputting a third signal containing chopping ripple at the chopping frequency; and a notch filler coupled to receive the output of the output chopper, the notch filter comprising a sampling capacitor, a hold capacitor, and a second set of switches between the sampling capacitor and the hold capacitor, wherein the sampling capacitor is directly coupled to an output of the output chopper with no switches therebetween, wherein the second set of switches is temporarily closed during each output chopper switch cycle to connect the sampling capacitor to the hold capacitor, pursuant to a phase 3 control signal at the chopper frequency, to transfer charge from the sampling capacitor to the hold capacitor at least once per switching cycle of the output chopper, wherein the hold capacitor is isolated from the output chopper during times when the second set of switches is open, such that the chopping ripple from the output chopper is not transferred to the hold capacitor.

2. The circuit of claim 1 wherein the clocked phase 1 and phase 2 control signals for the output chopper have a non-overlapping time, and wherein the phase 3 control signal for the notch filter occurs during the non-overlapping time.

3. The circuit of claim 1 wherein the phase 3 control signal occurs at a same time during each output chopper switching cycle.

4. The circuit of claim 1 wherein the output of the input chopper is a first differential signal, the output of the amplifier is a second differential signal, the output of the output chopper is a third differential signal, and the output of the notch filter is a fourth differential signal.

5. The circuit of claim 4 further comprising a zeroing switch coupled across differential outputs of the amplifier, wherein the zeroing switch is controlled by the same phase 3 control signal used to control the second set of switches.

6. The circuit of claim 4 further comprising a zeroing switch coupled across differential outputs of the amplifier, wherein the zeroing switch is [controlled by a phase 4 control signal that occurs] *closed* at least once per output chopper switching cycle.

7. The circuit of claim 6 wherein the [phase 4 control signal occurs] *zeroing switch is closed* twice per output chopper switching cycle.

8. The circuit of claim 4 further comprising a zeroing switch coupled across differential outputs of the output chopper, wherein the zeroing switch is controlled by the same phase 3 control signal used to control the second set of switches.

9. The circuit of claim 8 further comprising a third set of switches between the zeroing switch and the sampling capacitor, wherein the third set of switches is controlled by a phase 4 control signal that is opposite to the phase 3 control signal.

10. The circuit of claim 4 further comprising a differential amplifier coupled to receive a voltage across the hold capacitor.

11. The circuit of claim 1 wherein the second set of switches comprises a first switch selectively coupling a first terminal of the sampling capacitor to a first terminal of the hold capacitor, and a second switch, having the same state as the first switch, selectively coupling a second terminal of the sampling capacitor to a second terminal of the hold capacitor.

12. The circuit of claim 1 wherein the first set of switches in the output chopper comprises four switches.

13. The circuit of claim 1 wherein all switches are transistor switches.

14. The circuit of claim 1 wherein the amplifier is directly connected to an output of the input chopper, and wherein the output chopper is directly connected to an output of the amplifier.

15. The circuit of claim 1 wherein the chopping frequency is a fixed frequency.

16. A method for generating a signal and reducing ripple in the signal comprising:

receiving an input signal by an input chopper;

receiving a first signal, corresponding to an output of the input chopper, by an amplifier;

receiving a second signal, corresponding to an output of the amplifier, by an output chopper synchronized with the input chopper, the output chopper comprising a first set of switches controlled by at least clocked phase 1 and phase 2 control signals at a chopping frequency, the output chopper outputting a third signal containing chopping ripple at the chopping frequency;

receiving the output of the output chopper by a notch filter, the notch filter comprising a sampling capacitor, a hold capacitor, and a second set of switches between the sampling capacitor and the hold capacitor, wherein the second set of switches is temporarily closed during each output chopper switch cycle to connect the sampling capacitor to the hold capacitor, pursuant to a phase 3 control signal at the chopper frequency, to transfer charge from the sampling capacitor to the hold capacitor at least once per switching cycle of the output chopper, wherein the hold capacitor is isolated from the output chopper during times when the second set of switches is open such that the chopping ripple from the output chopper is not transferred to the hold capacitor; and wherein the output of the amplifier is a first differential output on first differential output terminals of the amplifier, and wherein the output of the output chopper is a second differential output on second differential output terminals of the output chopper, the method further comprising shorting either the first differential output terminals of the amplifier or the second differential output terminals of the output chopper together at least once per output chopper switching cycle.

17. The method of claim 16 further comprising shorting the first differential output terminals at least once per output chopper switching cycle.

18. The method of claim 17 wherein the shorting is performed by a zeroing switch coupled across the first differential output terminals of the amplifier.

19. The method of claim 17 wherein the shorting is performed by a zeroing switch coupled across the second differential output terminals of the output chopper.

20. The method of claim 17 wherein the shorting is performed by closing the first set of switches in the output chopper.

*21. An apparatus with notch filtering for chopping ripple, the apparatus comprising:*

*a chopper stabilized circuit having a differential input configured to receive a differential input signal and a differential output configured to provide a differential output signal having chopping ripple, wherein the chopper stabilized circuit comprises an input chopper, an amplification circuit, and an output chopper, wherein the output chopper comprises a plurality of output chopper switches controlled by at least a phase 1 control signal and a phase 2 control signal of a chopping frequency; and*

*a switched capacitor notch filter connected to the differential output and configured to filter the chopping ripple of the differential output signal, wherein the switched capacitor notch filter comprises a sampling capacitor, a hold capacitor, and a plurality of notch filter switches between the sampling capacitor and the hold capacitor,*

*wherein the notch filter switches are controlled by a phase 3 control signal of the chopping frequency, wherein the notch filter switches close to connect the sampling capacitor to the hold capacitor during a first portion of the phase 3 control signal, and open to inhibit transfer of the chopping ripple to the hold capacitor during a second portion of the phase 3 control signal,*

*wherein the first portion of the phase 3 control signal is different in duration than the second portion of the phase 3 control signal,*

*wherein the sampling capacitor is directly connected to the differential output of the chopper stabilized circuit.*

*22. The apparatus of claim 21 wherein the first portion of the phase 3 control signal is shorter than the second portion of the phase 3 control signal.*

*23. The apparatus of claim 21 wherein the phase 1 control signal and the phase 2 control signal have a period of non-overlap in which each of the output chopper switches is open, wherein the first portion of the phase 3 control signal occurs within the period of non-overlap.*

*24. The apparatus of claim 21 wherein the phase 3 control signal is a short pulse.*

*25. The apparatus of claim 21 further comprising an amplifier including a differential input configured to receive a voltage across the hold capacitor.*

*26. The apparatus of claim 25 wherein the amplifier comprises a trans-conductance amplifier.*

*27. The apparatus of claim 21 wherein the amplification circuit comprises a trans-conductance amplifier.*

*28. The apparatus of claim 21 wherein transitions of the phase 3 control signal occur at a same time during each switching cycle of the output chopper.*

*29. An apparatus with notch filtering for chopping ripple, the apparatus comprising:*

*a chopper stabilized circuit having a differential input configured to receive a differential input signal and a differential output configured to provide a differential output signal having chopping ripple, wherein the chopper stabilized circuit comprises an input chopper, an amplification circuit, and an output chopper;*

*a switched capacitor notch filter connected to the differential output and configured to filter the chopping ripple of the differential output signal, wherein the switched capacitor notch filter comprises a sampling capacitor, a hold capacitor, and a plurality of notch filter switches between the sampling capacitor and the hold capacitor; and*

*an amplifier including a differential input configured to receive a voltage across the hold capacitor,*

*wherein the switched capacitor notch filter provides only one differential signal path from the differential output of the chopper stabilized circuit to the differential input of the amplifier,*

*wherein the sampling capacitor is directly connected to the differential output of the chopper stabilized circuit.*

*30. The apparatus of claim 29 wherein the amplifier comprises a trans-conductance amplifier.*

*31. An apparatus with notch filtering for chopping ripple, the apparatus comprising:*

*a chopper stabilized circuit having a differential input configured to receive a differential input signal and a differential output configured to provide a differential output signal having chopping ripple, wherein the chopper stabilized circuit comprises an input chopper, an amplification circuit, and an output chopper; and*

*a switched capacitor notch filter connected to the differential output and configured to filter the chopping ripple of the differential output signal, wherein the switched capacitor notch filter comprises a sampling capacitor, a hold capacitor, and a plurality of notch filter switches between the sampling capacitor and the hold capacitor,*

*wherein the sampling capacitor and the hold capacitor are the only capacitors of the switched capacitor notch filter,*

*wherein the sampling capacitor is directly connected to the differential output of the chopper stabilized circuit.*

*32. The apparatus of claim 31 further comprising an amplifier including a differential input configured to receive a voltage across the hold capacitor.*

*33. The apparatus of claim 32 wherein the amplifier comprises a trans-conductance amplifier.*

* * * * *